(12) United States Patent
Ryckman et al.

(10) Patent No.: US 10,901,682 B2
(45) Date of Patent: Jan. 26, 2021

(54) ELECTRONIC DEVICE WITH EMBEDDED MICROCHIP

(71) Applicant: AfterMaster, Inc., Scottsdale, AZ (US)

(72) Inventors: Lawrence G. Ryckman, Scottsdale, AZ (US); Sheldon G. Yakus, Minden, NV (US)

(73) Assignee: AfterMaster, Inc., Scottsdale, AZ (US)

( * ) Notice: Subject to any disclaimer, the term of this patent is extended or adjusted under 35 U.S.C. 154(b) by 126 days.

(21) Appl. No.: 16/114,462

(22) Filed: Aug. 28, 2018

(65) Prior Publication Data

US 2019/0065138 A1 Feb. 28, 2019

Related U.S. Application Data

(63) Continuation-in-part of application No. 15/091,595, filed on Apr. 6, 2016, now Pat. No. 10,063,969.

(51) Int. Cl.
| | |
|---|---|
| G06F 3/16 | (2006.01) |
| H03G 5/02 | (2006.01) |
| G11B 27/031 | (2006.01) |
| H04R 3/04 | (2006.01) |
| H03G 9/18 | (2006.01) |
| H03G 3/02 | (2006.01) |
| H03G 5/00 | (2006.01) |
| H03G 5/16 | (2006.01) |
| H03G 9/02 | (2006.01) |
| H03G 9/00 | (2006.01) |

(52) U.S. Cl.
CPC ............ *G06F 3/165* (2013.01); *G11B 27/031* (2013.01); *H03G 3/02* (2013.01); *H03G 5/005* (2013.01); *H03G 5/025* (2013.01); *H03G 5/165* (2013.01); *H03G 9/005* (2013.01); *H03G 9/025* (2013.01); *H03G 9/18* (2013.01); *H04R 3/04* (2013.01); *H04R 2430/01* (2013.01)

(58) Field of Classification Search
CPC ......... G06F 3/165; G11B 27/031; H03G 3/02; H03G 3/005; H03G 5/025; H03G 5/165; H03G 9/005; H03G 9/025; H03G 9/18; H04R 3/04; H04R 2430/01
See application file for complete search history.

(56) References Cited

U.S. PATENT DOCUMENTS

| | | | | |
|---|---|---|---|---|
| 6,195,439 | B1 * | 2/2001 | Fukui | H03G 9/00 381/104 |
| 2006/0215857 | A1 * | 9/2006 | Hirano | H04H 60/04 381/119 |
| 2008/0041220 | A1 * | 2/2008 | Foust | G11B 27/031 84/625 |
| 2011/0153045 | A1 * | 6/2011 | Ryckman | H03G 5/005 700/94 |
| 2014/0098961 | A1 * | 4/2014 | Adachi | G11B 20/10527 381/17 |
| 2014/0254826 | A1 * | 9/2014 | Allen | G10H 3/186 381/98 |

OTHER PUBLICATIONS

Texas Instrument, Audio DSP with analog interface (Year: 2011).*

* cited by examiner

*Primary Examiner* — Davetta W Goins
*Assistant Examiner* — Kuassi A Ganmavo
(74) *Attorney, Agent, or Firm* — The Weintraub Group, P.L.C.

(57) ABSTRACT

An electronic audio device has a microchip has embedded therein, circuitry for enhancing the sound outputted therefrom and which is associated, such as a radio, television, headphones, earbuds and the like.

2 Claims, 5 Drawing Sheets

ELECTRONIC DEVICE WITH EMBEDDED MICROCHIP

CROSS REFERENCE TO RELATED APPLICATIONS

This application is a continuation-in-part application of co-pending U.S. patent application Ser. No. 15/091,595 filed Apr. 6, 2016 "Microchip for Audio Enhancement Processing", the disclosure of which is hereby incorporated by reference including the drawing.

BACKGROUND OF THE INVENTION

In co-pending U.S. patent application Ser. No. 12/807,361 filed Sep. 2, 2010, for "Audio Remastering System", the disclosure which is hereby incorporated by reference, there is a disclosed a system for re-mastering audio media to enable users or owners to enhance the sound quality of their audio recordings. The system described therein essentially comprises creating one or more secondary signals or layers from an "initial", i.e. user owned, possessed or licensed, audio recording, and "processing" these secondary signals through various electronic devices including limiters, compressors, equalizers, etc., at substantially the same time but at different frequencies. When this treatment of the secondary signals is completed, the signals are merged and the resulting output provides an enhanced sound both in volume and in clarity.

However, the system described therein, while being efficacious, does not address the modern day economic and electronic world where audiophiles want to listen to enhanced audio recording through head phones, ear buds and the like. To address this issue, it becomes necessary to enable not only a remastering or mastering, but listening to an "original" audio file through headphones, ear buds and the like.

As disclosed hereinafter the present invention addresses these issues.

SUMMARY OF THE INVENTION

An electronic audio device has a microchip having software embedded therein for enhancing the sound of an inputted audio signal.

The audio signal comprises layering a duplicate of the original inputted signal.

According to the present invention, the duplicated inputted signal is split into at least two exact duplicates of the original signal and are then processed as layers and, thereafter, recombined and outputted therefrom.

The circuitry associated with the microchip can be provided as a single integrated circuit or a microcircuit. All processing is done in the digital domain.

The present chip can be deployed in various electronic devices, including headphones, earbuds, audio speakers, radios, televisions or other similar electronic devices.

For a more complete understanding of the present invention, reference is made to the following detailed description and accompanying drawing. In the drawing, numbers refer to like parts throughout the several views in which:

DESCRIPTION OF THE PREFERRED EMBODIMENT

At the outset, it is to be understood that the term "layer", as used herein, means a copy of a signal that is layered or placed, at least in part, on top of an initial signal or a duplicate of that initial signal.

According to the present invention, in general, enhancement is achieved by embedding in a microchip software which takes an initial or a duplicate of an initial recording or audio file and creating a signal of that initial or duplicated initial and at least one secondary signal which is an exact copy of that initial or duplicated audio file and creating at least two layers therefrom. Preferably, each of the layers is processed initially by an equalizer which is at a selected frequency. The frequencies of each layer can be the same or different from each other.

Preferably, at least one of the layers is processed by passing it through preselected electronic equipment, e.g. plug-ins and/or outboard gear. As described in the co-pending application, the volumes are initially adjusted. Then, after at least one layer is processed, the layers are recombined and passed through a combining bus and have their volumes adjusted and/or outputted from there.

Figure 1:
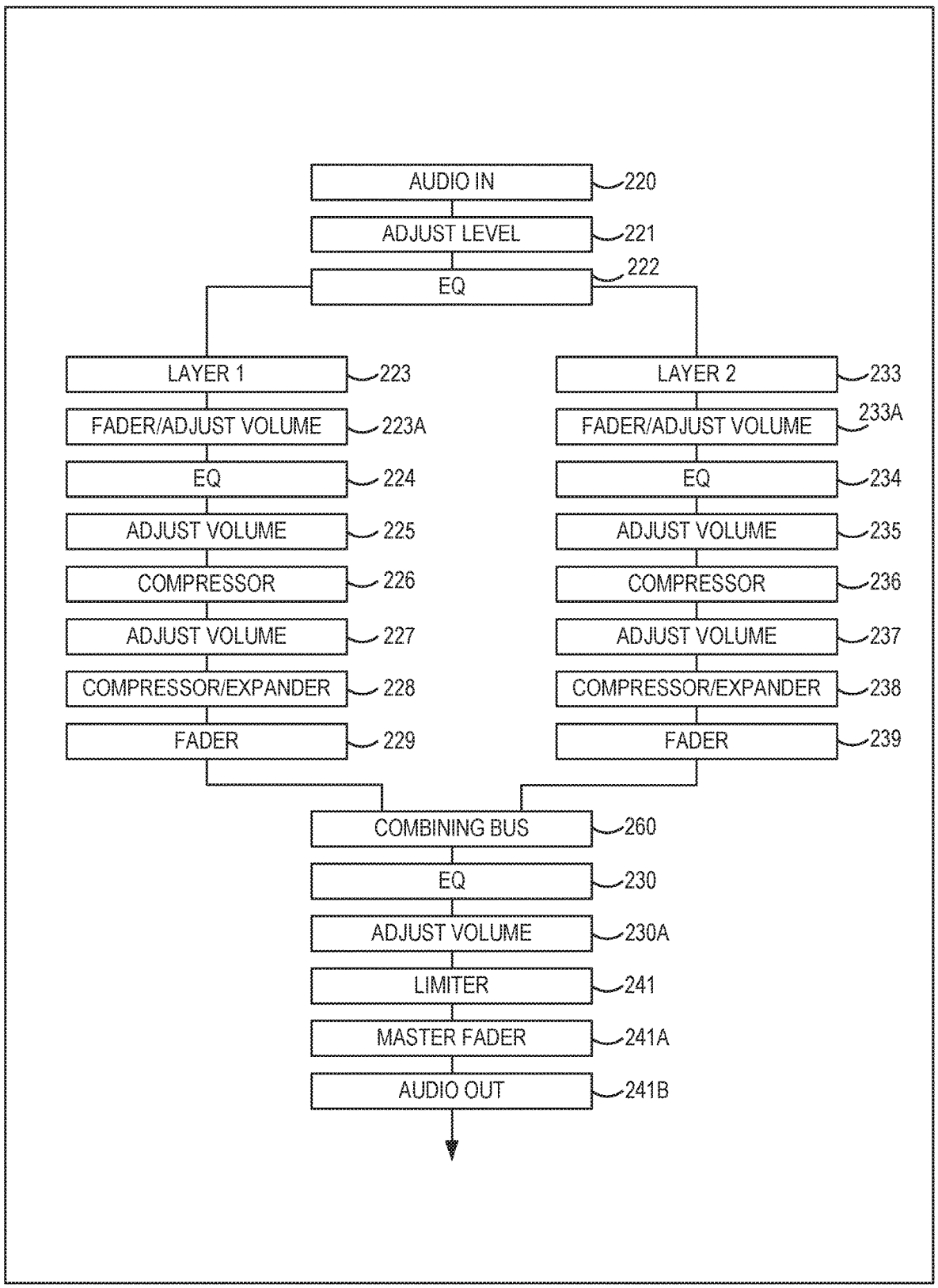
FIG. 1 is a flowchart showing a sound flow processing system in accordance herewith.

As shown in FIG. 1, an electronic audio device 10 has a microchip 12 embedded therein. According to this invention, a copied or duplicated audio signal 220 is processed at 221. Once the original signal is inputted into the device, it is processed by the chip, beginning at step 221. Typically, the level is adjusted to about 8 to 16 dB. A standard volume control is utilized. Alternatively, the signal volume may be raised or adjusted at any point in the enhancement process, i.e. when premastering, mastering or remastering.

The equalizer 222 either filters out any unwanted frequencies or boosts or adds frequencies in the duplicate. The output from the equalizer is split into the at least one exact copy of the initial signal or file and the secondary signal which is an exact duplicate of the signal of the initial identified as Layers 1 and 2, respectively. In FIG. 1, this is shown as Layer 1 at 223 and Layer 2 at 233. Frequencies in the range of 125 to 400 cycles per second can be adjusted to any desired levels or volume. Any subsequent layers will be affected by this reduction. The use of the equalizer can, if desired, be eliminated, but has been found important in facilitating processing of the signal during subsequent processing in each of the layers 223, 233.

Although not shown in the drawing, if desired, more than two layers can be produced such as Layer 3, Layer 4, etc. which can be processed according to the manner shown in FIG. 1

During the processing of Layer 1 denoted at 223, Layer 1 is first adjusted in volume by fader 223a and is, then, processed by equalizer 224; adjusted in volume at 225 via an equalizer volume control; compressed by compressor 226; adjusted in volume by a compressor volume control, again, at 227; processed by compressor/expander 228; has its volume once again adjusted by the fader at 229; processed by equalizer 230; adjusted in volume, again, by an equalizer volume control at 230a; and, then, processed by limiter 241 and sent to the output through master fader 241a and output 241b.

Layer 2 denoted at 233 is processed in the same manner as Layer 1 processing and, therefore, Layer 2 is first adjusted in volume by fader 233a; processed by equalizer 234; then adjusted in volume by the equalizer volume control at 235; processed by compressor 236; adjusted in volume again by the compressor volume control at 237; processed by compressor/expander 238; adjusted in volume again at the fader 239; merged atop or layered atop Layer 1 at a combining bus layered signals 260 prior to entry into the equalizer 230 where the merged layers are processed by equalizer 230; undergoes final adjustment in volume 230a by the equalizer volume control; processed by limiter 241 and outputted through master fader 241a and outputted at 241b.

More particularly, just prior to entry into the equalizer 230 the combining bus 260 is used to layer the incoming signals which then layered signals are processed together. The output is thus the layered enhanced audio.

Synchronization of the processing of all layers is important. The time required for each layer to pass through its respective processing is substantially equivalent so that each layer's signal takes substantially the same amount of time to pass through its processing and merge at the combining bus 260 and be outputted as at 241b. Preferably, processing is done at the same time.

The signals produced by each layer 223, 233 can be equal in loudness, but in most cases, usually Layer 1 223 is louder than Layer 2 at 233. For example, Layer 1 can have its bass minimized while emphasizing and processing higher frequencies. Layer 2 can have its higher frequencies minimized while emphasizing bass frequencies or vice versa.

Similarly, If the bass frequencies in the initial audio signal are weak, Layer 2 processing can increase the loudness of the bass frequencies so that when the processed signals are joined at the combining bus 260 and prior to entry into the equalizer 230, volume adjusted 230a, and passed through the limiter 241, master fader 241a and output 241b, the resulting audio signal, ordinarily or usually, increases a bass component with a greater volume and presence than is the case in the initial audio signal or vice versa.

Layer 1 and Layer 2, each, ordinarily, focuses on a band of frequencies that is different from any band of frequencies focused in the other layer. The frequencies that are not being focused on in one layer are being focused on in another layer and complement each other.

After enhancement, the dynamic range appears to be retained. When a compressor such as at 226, 236, is utilized, the threshold setting is typically adjusted to the user's desires. Preferably, each layer is processed with the equivalent at least one piece of enhancement equipment. While the processing shown in FIG. 1 is preferred, in practicing the present invention, it is essential that the signal pass through two pieces of equipment, e.g., compressor/expander and fader, etc. As used herein, the term "multiple pieces of equipment" is intended to include the equivalent of a single piece of electronic equipment which provides one or more multiple functions, e.g. compressing, volume reduction, enhances, equalizing, etc.

In general, the particular frequencies that Layer 1 or Layer 2 emphasize will experience an adjustment in volume compared to their volume levels when the signals first enter into the f the present layering process beginning at the equalizer 222.

Referring to FIGS. 2 through 7, there is shown a microchip circuit or other suitable apparatus for use in performing the method of the present invention. This apparatus may be provided as a single integrated circuit or micro circuit 400. Preferably, all processing is done in the digital domain. Generally, the input signal comprises a 16-bit input and 16-bit output with a sample rate of 48,000 samples per second, although these particular specifications are optional and not necessary for practicing the invention. In other embodiments, other specifications may be used.

Figure 2:
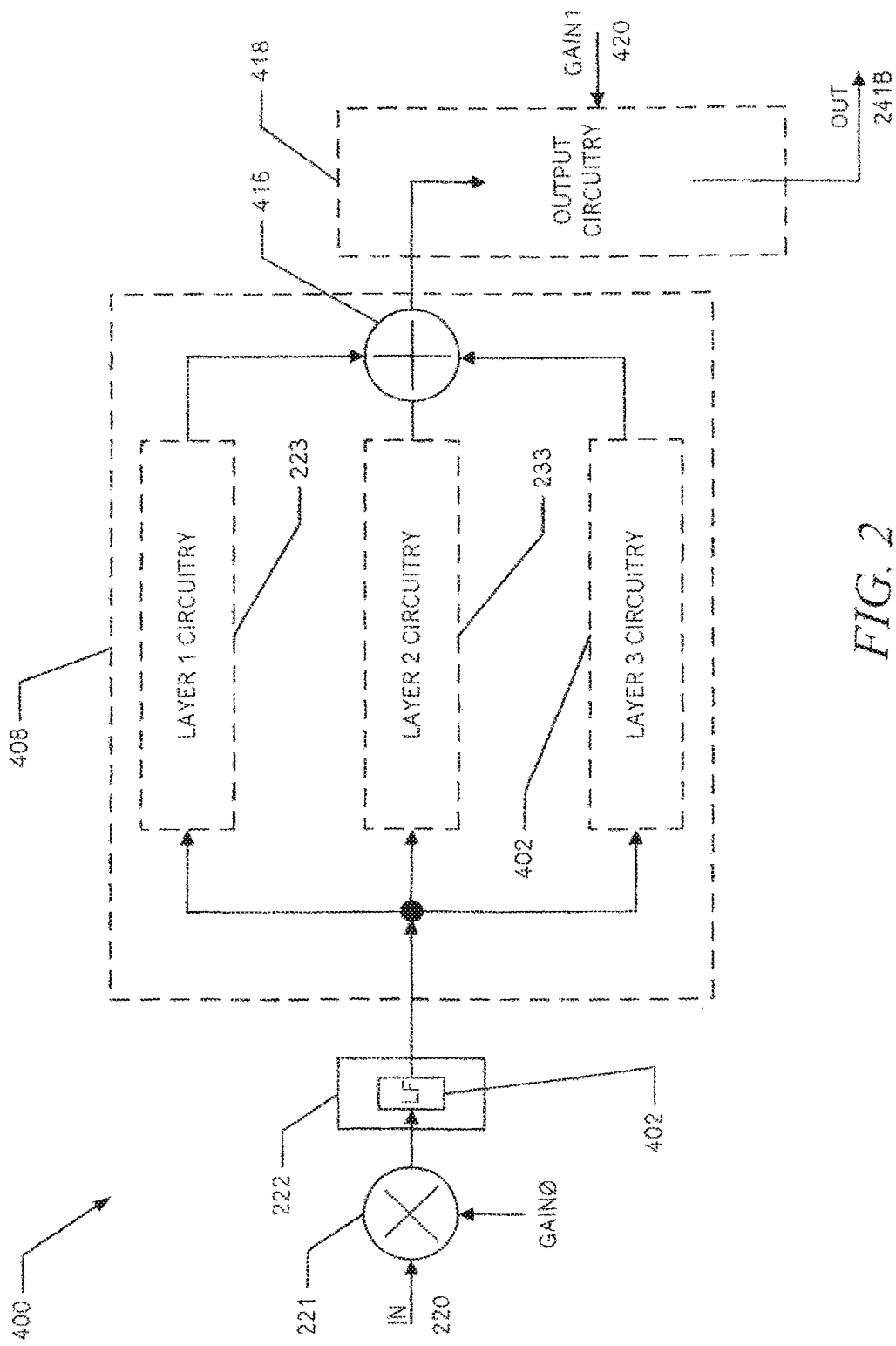
FIG. 2 is a schematic block diagram of a circuit having three branches and which is suitable for use in at least one configuration of sound flow processing system of FIG. 1.

Referring now to FIG. 2, which is a is a schematic block diagram of a circuit having three branches and which is suitable for use in at least one configuration of sound flow processing the system of FIG. 1. To adjust the volume level, signal 220 is passed through an electronic gain control (e.g., a multiplier circuit) 221, which acts as a volume control. An equalizer 222 either filters out any unwanted frequencies or boosts or adds frequencies in the duplicate signal. In the embodiment represented in FIG. 3, equalizer 222 comprises an LF circuit 402. The output of equalizer 222 is processed by audio layer processing circuitry 408.

In the embodiment represented by FIG. 2, three separate layers, denoted as Layer 1 Circuitry 223, Layer 2 Circuitry 233, and Layer 3 Circuitry 402 are provided. It will be understood that the number of layers provided may vary in different embodiments. The input of each of the three layers 223, 233, and 402 is split off the output of equalizer 222 and the output of the three layers 223, 233, and 402 is added together by adder accumulator 416. The output of adder or summer 416 is provided to output circuitry 418, where, among other things, the output gain is controlled by a signal 420, and the output is provided at 241B.

Figure 3:
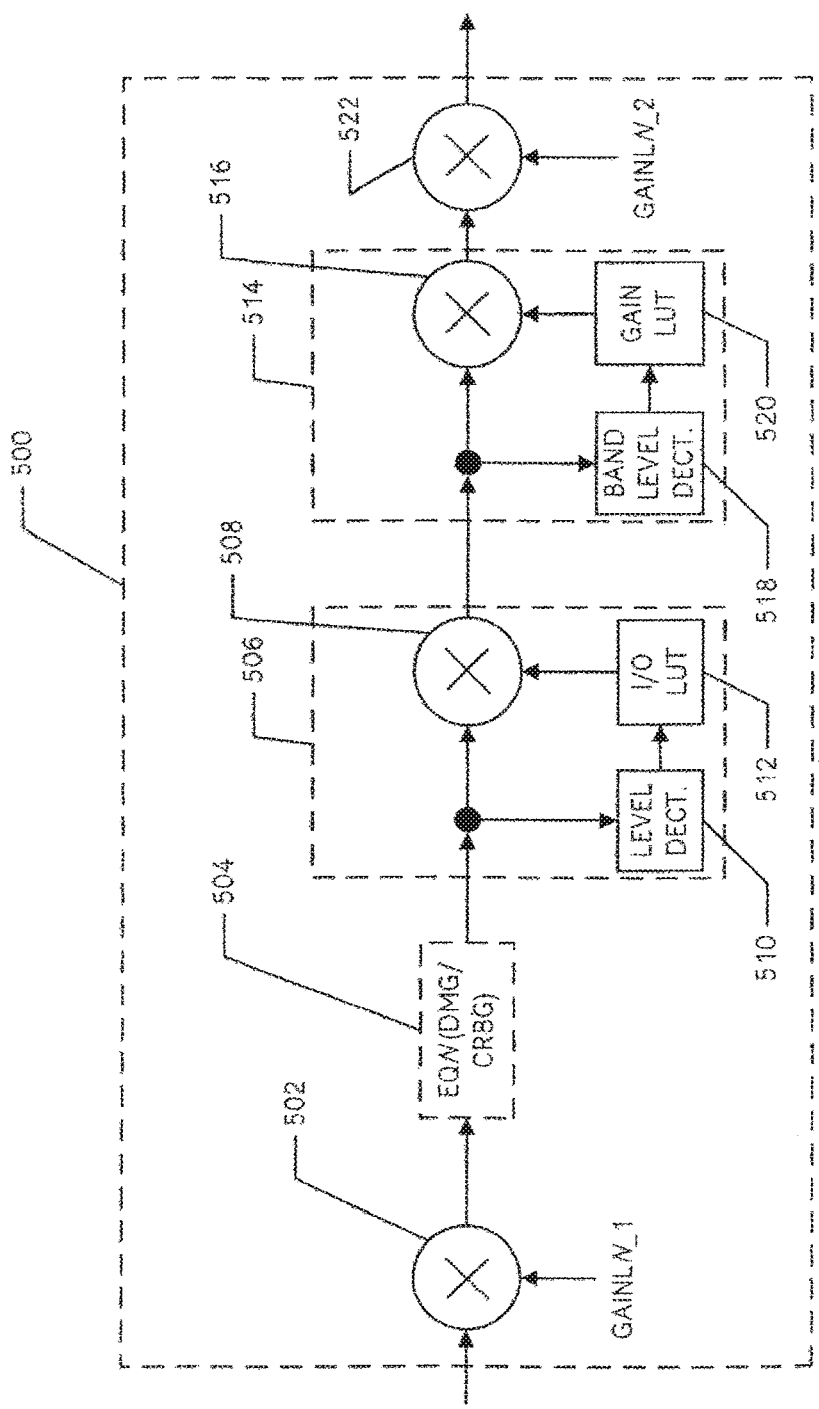
FIG. 3 is a schematic block diagram of a configuration of a circuit branch suitable for use in the circuit represented by FIG. 2.
Figure 5:
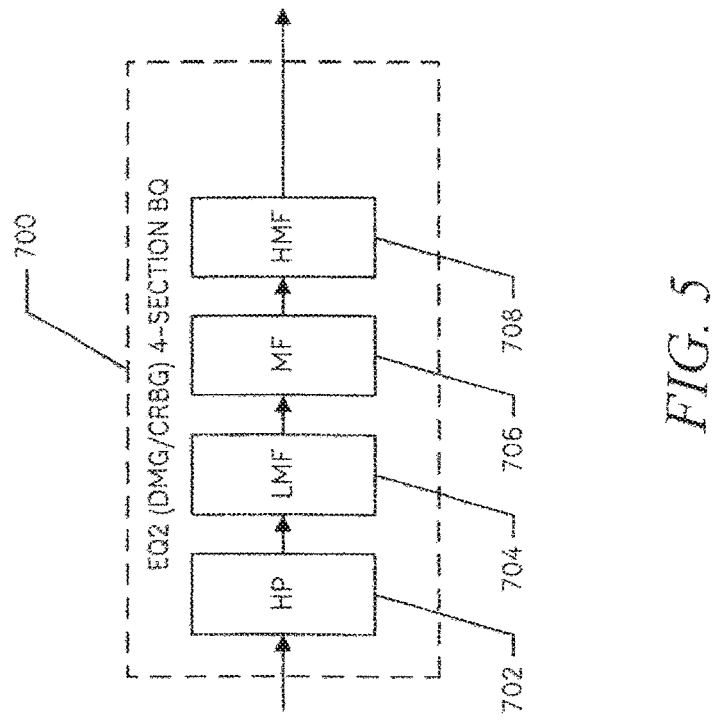
FIG. 5 is a schematic block diagram of an equalizer EQ2 (DMG/CRBQ) suitable for use in the circuit represented by FIG. 4 when the circuit represented by FIG. 4 is a second circuit branch.

Referring now to FIG. 3, typical circuitry 500 for either Layer 1 Circuitry 223, Layer 2 Circuitry 233, and Layer 3 Circuitry 402 comprises an electronic gain level control or multiplier 502 denoted GAINLN_1, where GAINLN_1 varies (or can vary) depending upon which layer N is being represented by circuitry 500. The output of gain level control or multiplier 502 is passed to a equalizer circuit EQN(DMG/CRBG) 504, which varies (or can vary) depending upon the layer N being represented by circuitry 500. The output of equalizer circuit 504 is passed through a compressor 506 to set a maximum volume. Compressor circuit 506 comprises a gain level control or multiplier 508 and a level detector 510, both of which are fed a signal split from the output of equalizer circuit 504. The output of level detector 510 is used as the input of input/output lookup table (I/O LUT) 512, which provides a gain control for gain level controller or multiplier 508, so that the output of the gain level controller or multiplier 508 does not exceed a certain maximum level.

The contents of I/O LUT 512 may vary depending upon which layer N is being represented by circuitry 500. The compressed output of gain level control or multiplier 508 is then applied to a compander/expander 514, wherein the same compressed output is applied as an input after splitting to both gain level control or multiplier 516 and band level detector 518. The output of band level detector 518 is applied to a gain LUT 520, which provides a gain control input for gain level control or multiplier 516. The circuitry of band level detector 518 and/or gain LUT 520 may vary depending upon which layer N is represented by circuitry 500.

The output of compressor/expander 514 is provided as an input to gain level control or multiplier 522, which, together with applied signal GAINLN_2, acts as an overall gain control for Layer N.

Figure 4:
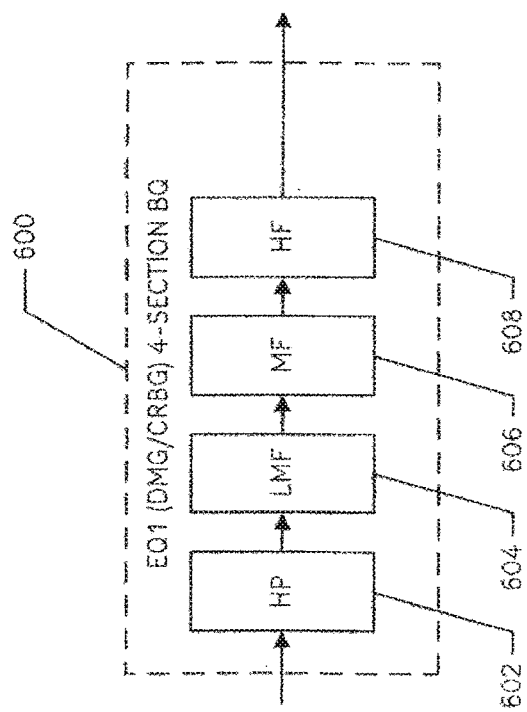
FIG. 4 is a schematic block diagram of an equalizer EQ1 (DMG/CRBQ) suitable for use in the circuit represented by FIG. 3 when the circuit represented by FIG. 3 is a first circuit branch.

In the embodiment represented by FIG. 3 and referring to FIGS. 3 and 4, for layer N=1, EQN(DMG/CRBG) 500 comprises an EQ1 (DMG/CRBG) 4-section BQ 600, in which the input signal from gain level control or multiplier 502 is applied to a circuit comprising a series connection of HP 602, LMF 604, MF 606, and HF 608.

Figure 6:
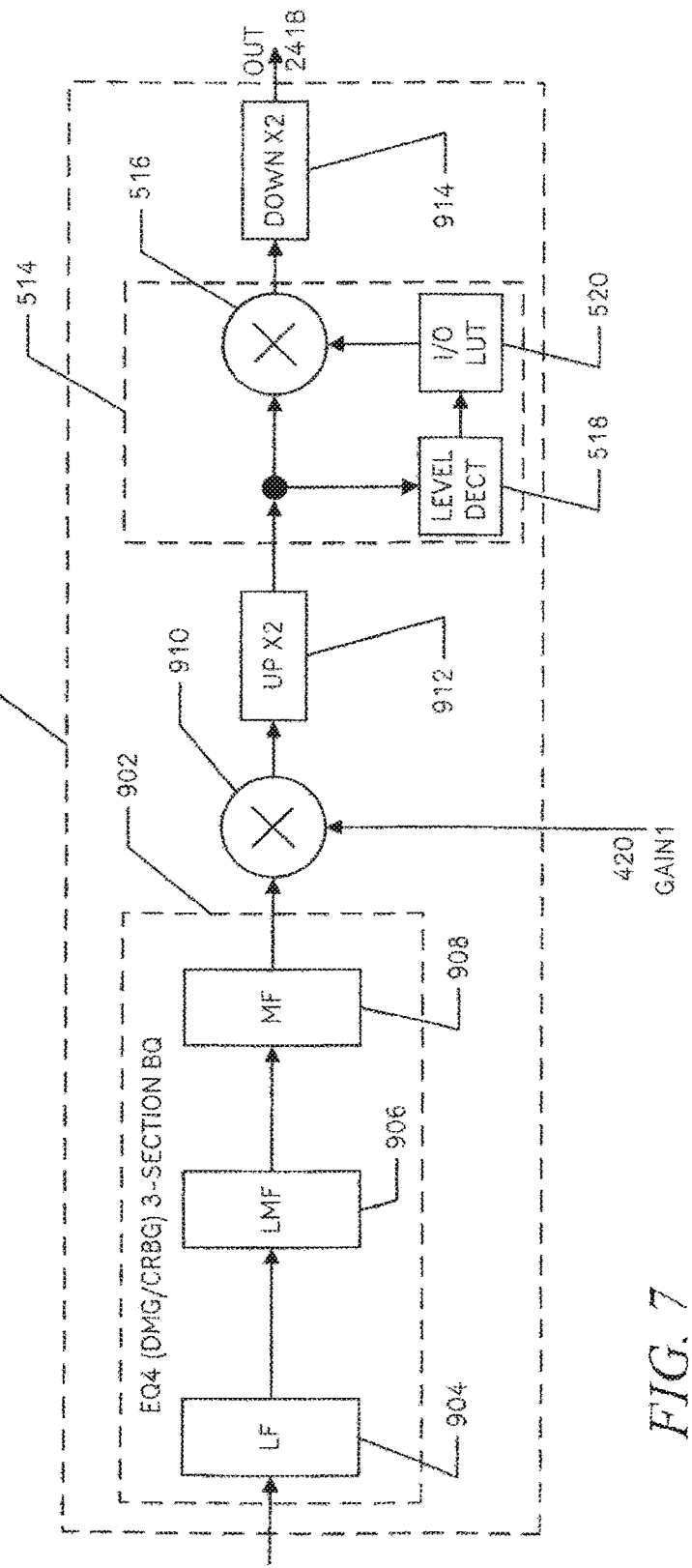
FIG. 6 is a schematic block diagram of an equalizer EQ3 (DMG/CRBQ) suitable for use in the circuit represented by FIG. 3 when the circuit represented by FIG. 3 is a third circuit branch.

Similarly, in the embodiment represented by FIG. 4 and referring to FIGS. 4 and 6, for layer N=2, EQN(DMG/CRBG) 500 comprises an EQ2 (DMG/CRBG) 4-section BQ 600, in which the input signal from gain level control or multiplier 502 is applied to a circuit comprising a series connection of HP 702, LMF 704, MF 706, and HF 708.

Figure 7:
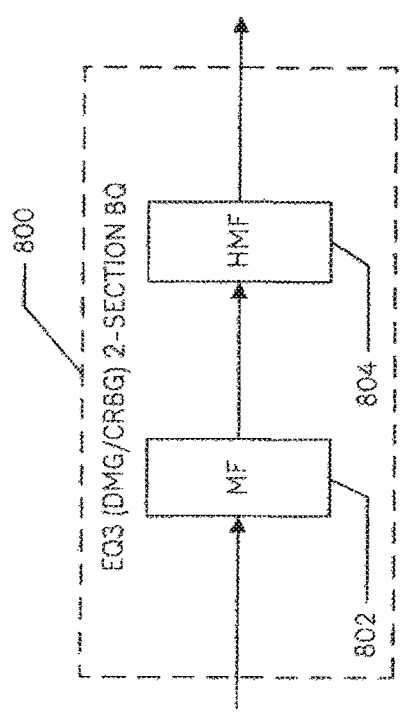
FIG. 7 is a schematic block diagram of an output circuit suitable for use in the circuit represented by FIG. 2.

Further, in the embodiment represented by FIG. 2 and referring to FIGS. 2 and 7, the sum of the various layers N is passed through output circuitry 418. The input signal of output circuitry 418 is pass through EQ4 (DMG/CRBG) 500, which comprises an EQ4 (DMG/CRBG) 3-section BQ 902, The output of EQ4 (DMG/CRBG) 902 is applied to an overall gain controller or multiplier 910, which uses signal GAIN1 420 to control the output level of the combined, processed signal after all the levels are combined. The output of overall gain controller or multiplier 910 is then digitally upconverted using UP X2 912 and applied as input to compander 514. The output of overall gain controller or multiplier 910 is split and applied to a gain controller or multiplier 516 and a level detector 518. The output of level detector 518 is applied to I/O LUT 520 to obtain a gain level for gain controller or multiplier 910. (Note that the level detector 518 and the I/O LUT 520 do not necessarily have the same specifications or content as those described in conjunction with FIG. 3.) The output of compander 514 is then down converted by DOWN X2 914, and the overall output of the circuit appears at output 241B.

It should be noted that in practicing the present invention, the processed audio signal may be monoaural, stereo, t.1 and the like.

The microchip can be installed in any suitable electronic audio device such as, for example, headphones, earphones, ear buds, audio speakers, radios, television and other similar electronic devices where the beneficial effects of the enhanced sound are readily apparent.

The invention claimed is:

1. An electronic audio device comprising:
a microchip having a circuit for processing audio signals, the circuit processing an inputted signal according to the following steps:
(a) reducing the volume of the inputted audio signal;
(b) processing the reduced volume signal through an equalizer;
(c) duplicating the inputted audio signal to provide at least one exact copy of the audio signal, the audio signal defining a first signal layer, the at least one exact copy defining an at least one exact equivalent secondary signal layer;
(d) separating the original inputted audio signal and the at least one exact equivalent secondary signal, each as a whole into two separate identical signal layers;
(e) reducing the amplitude in each of the signal layers;
(f) synchronously processing at the same time and without any time delay between the signals, the identical separate signal layers by;
(i) sequentially processing each of the signal layers with at least two simulated pieces of equipment selected from the group consisting of a limiter, an expander, a compressor, and an equalizer, either the original or the at least one equivalent secondary signal layers being processed within a first range of frequencies and the other of the original or the at least one equivalent secondary signal layer within a different range of frequencies; and
(ii) reducing the volume of each of the signal layers as a whole when each signal layer is transmitted from one of the above pieces of equipment to another of the above pieces of equipment;
(g) merging the processed signal layers at a combining bus, and processing together simultaneously the merged signal layers through at least an equalizer, limiter and master fader and then outputted, and wherein the time for processing each of the signal layer is the same; and
wherein the device is selected from the group consisting of a hearing aid, a radio, a television, headphones, ear buds, vehicular systems, and audio speakers.

2. The device of claim 1 wherein the circuit defines:
(a) means for inputting an original audio file into a signal divider and for outputting the original audio file and at least one exact duplicate of the original audio file;
(b) a first equalizer in communication with the means for inputting and outputting, the equalizer simultaneously and at the same time lowering the volume of the original audio file and the at least one exact duplicate;
(c) means for processing each audio file outputted from the first equalizer simultaneously and at exactly the same time without any time delay between the signals, each means for processing having an associated audio file associated therewith each means for processing, comprising:
(1) a first fader in communication with the first equalizer;
(2) a second equalizer receiving the output from the fader;
(3) means for lowering the volume of an output from the fader;
(4) means for lowering the volume of the output from the compressor, the compressor having an output;
(5) An expander which receives the output from the second means for lowering the expander having an output;
(6) means for lowering the volume of the output from the expander;
(7) a second fader receiving the lowered volume from the expander;
(8) a combining bus for receiving and merging the output from the faders;
(9) a second equalizer for processing the merged signals;
(10) a second limiter, the output from the second limiter being in communication with the second equalizer and outputting to a master fader; and
(11) a master fader for outputting the signal from the second limiter.

* * * * *